(12) United States Patent
Boon et al.

(10) Patent No.: US 6,433,532 B1
(45) Date of Patent: Aug. 13, 2002

(54) METHOD AND APPARATUS FOR MOUNTING A LOAD BOARD ONTO A TEST HEAD

(75) Inventors: Wong Han Boon; Tan Seok Hiong; Aw Chin Kiat, all of Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 14 days.

(21) Appl. No.: 09/612,414

(22) Filed: Jul. 7, 2000

(51) Int. Cl.$^7$ ............................................... G01R 31/02
(52) U.S. Cl. ..................... 324/158.1; 324/755
(58) Field of Search ................. 324/754, 755, 324/757, 758, 761, 765, 158.1

(56) References Cited

U.S. PATENT DOCUMENTS

| | | | | |
|---|---|---|---|---|
| 4,626,779 A | * | 12/1986 | Boyle | 324/754 |
| 4,636,723 A | * | 1/1987 | Coffin | 324/763 |
| 5,081,415 A | | 1/1992 | Liu et al. | 324/537 |
| 5,192,907 A | * | 3/1993 | Bonaria | 324/758 |
| 5,552,701 A | | 9/1996 | Veteran et al. | 324/158.1 |
| 6,259,265 B1 | * | 7/2001 | Han et al. | 324/761 |

\* cited by examiner

*Primary Examiner*—Michael J. Sherry
*Assistant Examiner*—Russell M. Kobert

(57) ABSTRACT

A load board feeder is secured to the center portion of a test head. The load board feeder uses a lift mechanism to control the movement of a locator block in vertical directions. A load board rests on the locator block and a location device on the locator block ensures alignment of the load board with a test head. When the load board feeder lowers the load board, the load board is properly seated on the test head without damaging delicate pogo pins.

14 Claims, 8 Drawing Sheets

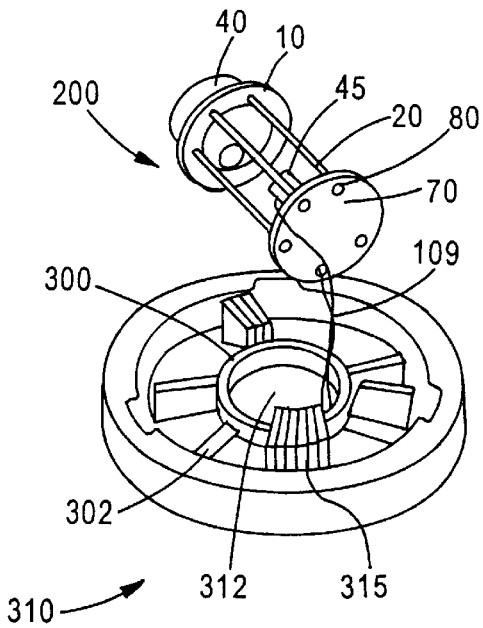
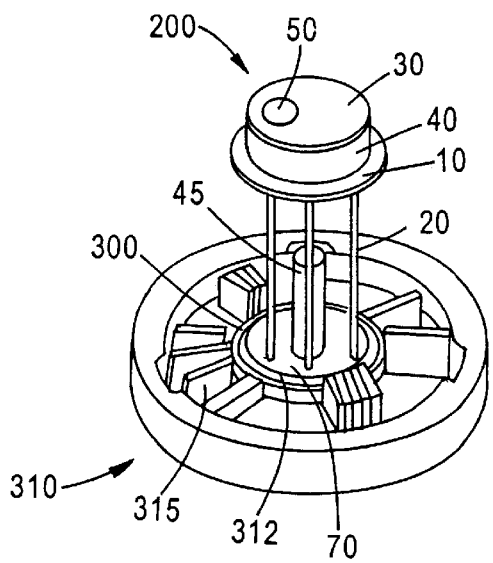
FIG. 4    FIG. 5
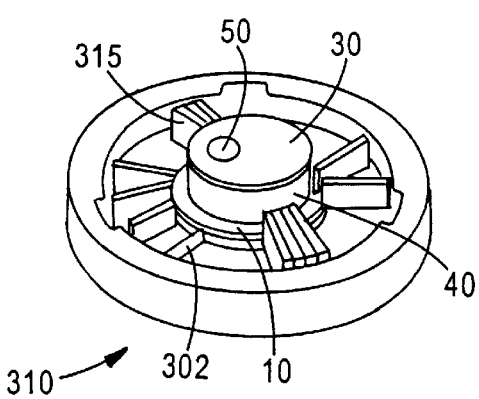
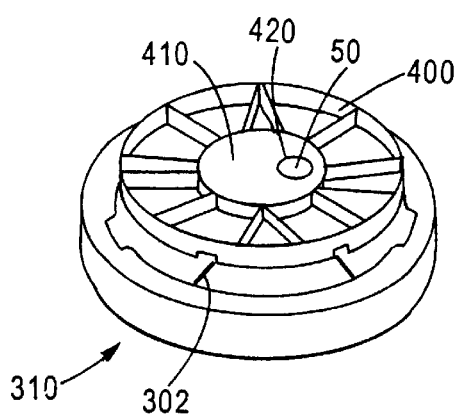
FIG. 6    FIG. 7

METHOD AND APPARATUS FOR MOUNTING A LOAD BOARD ONTO A TEST HEAD

FIELD OF THE INVENTION

The present invention relates to load boards for testing integrated circuits, and particularly to mounting a load board onto a test head.

DESCRIPTION OF RELATED ART

A test head and a load board are used to test the functionality of newly manufactured integrated circuits. The integrated circuits to be tested are connected to a load board prior to testing. The test head provides power and controls the flow of electricity to the integrated circuits attached to the load board 325 (FIG. 9) during testing. As seen in FIG. 3, a test head 310 may be circular in shape and have an aperture through the middle. Channel cards 315 are arranged around the circumference of the interior aperture 312 and contain pogo pins 320 on the upper surface of the channel cards 315. As seen in FIG. 12, pogo pins 320 are spring loaded pins, for example the pin portion 322 is able to recede into the spring containing portion 324, that provide electrical contact between the test head channel cards 315 and the load board 325 via slots 326 on the underside of the load board 325.

Load boards are electromechanical printed circuit boards used for testing the functionality of integrated circuits. A load board is latched onto a test head, and therefore, must be properly aligned with the test head so that the pogo pins 320 correctly contact the load board. Proper alignment ensures electrical contact between the test head channel cards 315 and the load board 325 so that the test head fully conducts testing of the integrated circuits. A schematic depiction of a load board 325 in electrical contact with the pogo pins 320 of a test card 315 that is connected to a test head 310 is provided in FIG. 13. A slot 326 on the underside of the load board 325 is depicted as the contact point between the pogo pins 320 and the load board 325.

Load boards are normally manually positioned onto test heads, leading to several concerns. Manually positioning a load board onto a test head makes it difficult to properly align the load board with the test head, which may result in improper contact of the pogo pins 320 with the load board 325. As a result, load boards are often shifted or adjusted after initial manual positioning in order to align the load board with the test head. However, the pogo pins 320 that the load board is already in contact with are spring loaded, and therefore, easily bent or broken. A damaged pogo pin 320 requires replacement of the channel card 315 that the damaged pogo pin 320 is part of, each channel card normally being very expensive. Replacing a channel card 315 also leads to test head down time, which delays production and causes additional expense.

SUMMARY OF THE INVENTION

There is a need to prevent bent and broken pogo pins on a test head channel card related to testing integrated circuits. There is also a need to ensure that load boards are properly aligned with test heads. These needs and others are addressed by the present invention, which provides alignment of the load board with the test head, and an automated system for positioning the load board onto the test head. According to the present invention, a load board feeder is installed into the center aperture of a test head. The load board feeder has a location device that engages the load board when the load board is properly aligned with the test head. The load board feeder also comprises a mechanism for lowering the load board into its seating place on the test head, without a damaging impact to the pogo pins on the test head channel cards. This mechanism prevents undue damage to the delicate pogo pins on the test head channel cards that may occur during manual positioning and alignment of the load board.

Accordingly, one aspect of the invention relates to a load board feeder for positioning a load board onto a test head that has an aperture through its center. The load board feeder comprises a base and a body connected to the base. An attachment device is connected to the body and is used to attach the load board feeder to the test head. A lift mechanism is connected to the base and vertically moves a block that is attached to the lift mechanism. The block contains the load board location device and serves as a resting place for the load board prior to positioning the load board onto the test head.

In certain embodiments, the load board feeder is cylindrically shaped, and contains a load board location device on a circular block. The load board location device comprises a circular plate attached to the block and a disk that engages the block and the plate. The circular block has a circular cavity that is not concentric with the center of the block. Likewise, the circular plate has a non-concentric, circular hole that aligns with the circular cavity in the block. The outer diameter of the circular disk is just small enough to allow the circular disk to fit within the circular hole and cavity. The top of the circular disk protrudes above the top of the plate, thereby providing an engagement element for a load board.

Accordingly, another aspect of the invention relates to a method of seating a load board onto a test head having an aperture through its center. A load board feeder, comprising a lift mechanism and a location device for aligning a load board with a test head, is attached within the center aperture of a test head. The load board feeder is brought to its raised position and a load board is placed onto the load board feeder. The load board is adjusted so that it engages the load board location device. The load board is aligned with the test head when the load board engages the load board location device. The lift mechanism is activated to lower the load board into its seating position on the test head and the load board is latched to the test head.

Other advantages of the present invention will become readily apparent from the following detailed description, simply by way of illustration of the best mode contemplated of carrying out the invention. The invention is capable of other and different embodiments, and its several details are capable of modifications in various obvious respects, all without departing from the invention. Accordingly, the drawing and description are illustrative in nature, not restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4 depicts air hoses for the load board feeder shown in FIG. 1 passing through the center aperture of the test head shown in FIG. 3.

FIG. 5 depicts the load board feeder shown in FIG. 1 positioned for insertion into the center aperture of the test head shown in FIG. 3.

FIG. 6 depicts the load board feeder shown in FIG. 1 inserted into the center aperture of the test head shown in FIG. 3 and attached to the center ring of the test head shown in FIG. 3.

FIG. 7 depicts a load board stiffener (without a load board for clarity) properly seated on the load board feeder depicted in FIG. 6.

DETAILED DESCRIPTION OF THE INVENTION

An apparatus for aligning and seating a load board onto a test head in a testing arrangement for testing integrated circuits is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1:
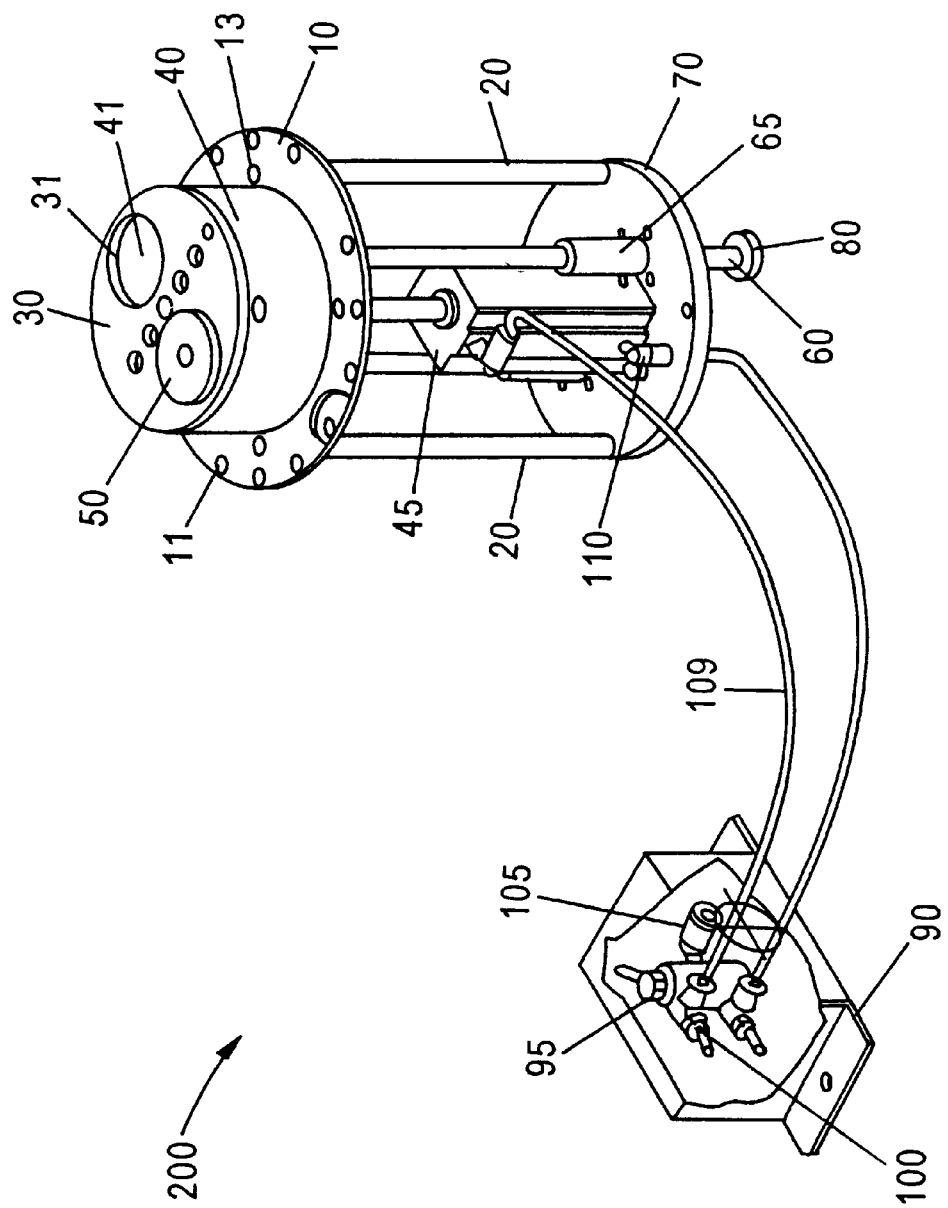
FIG. 1 depicts an embodiment of a load board feeder of the present invention.

FIG. 1 depicts an embodiment of a load board feeder according to the present invention. The load board feeder allows a load board to be properly aligned with a test head before the load board is positioned onto the test head. The load board feeder also mechanically lowers the load board onto the test head. By aligning and mechanically lowering the load board onto the test head, the load board feeder prevents the delicate pogo pins of the channel cards from becoming bent or broken, as is common when a load board is manually positioned onto a test head.

Assembly of an Embodiment of the Invention

Figure 2:
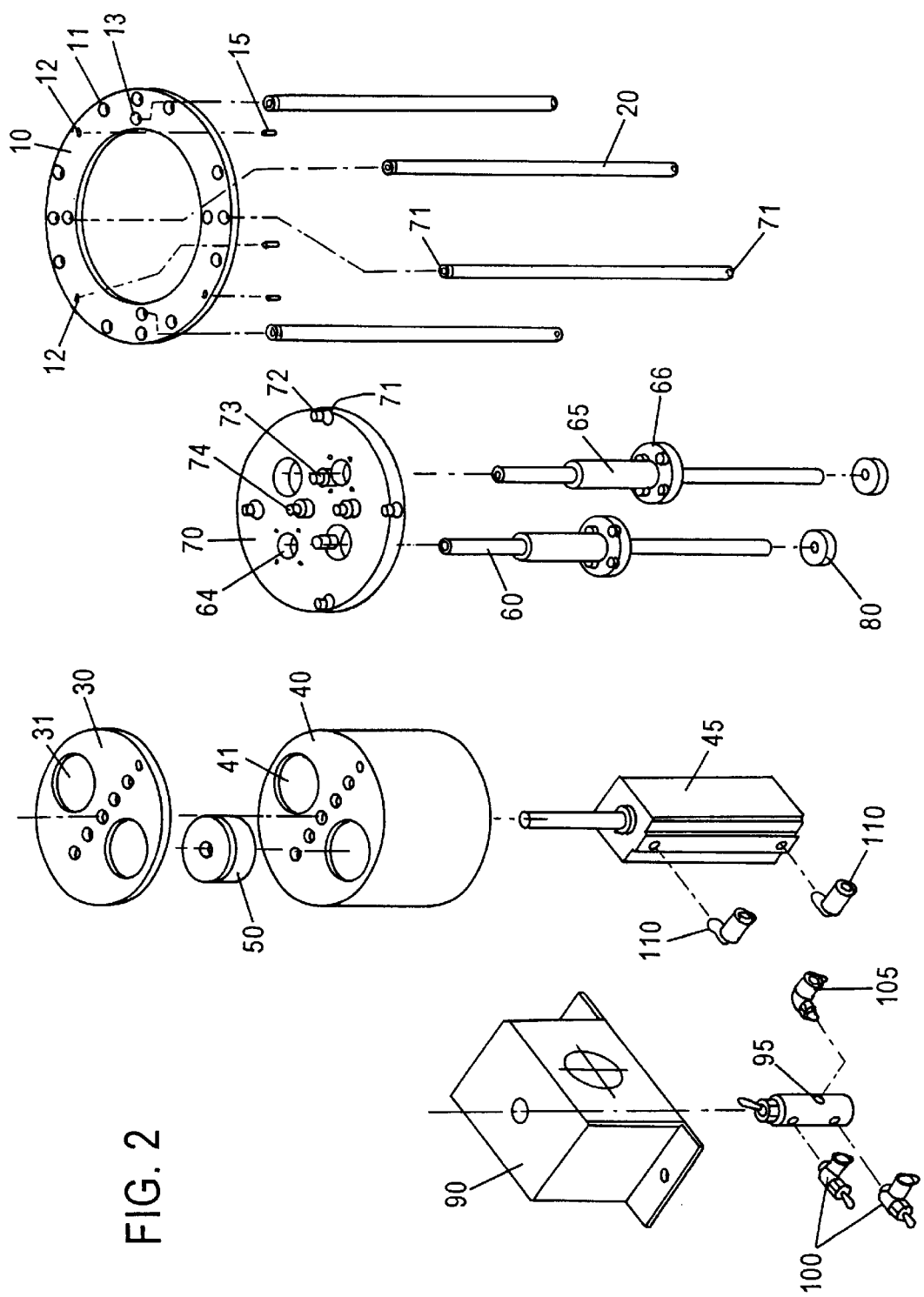
FIG. 2 depicts an exploded view of the load board feeder depicted in FIG. 1.

Referring to FIGS. 1 and 2, components and assemblage of an embodiment of the present invention are described. A top ring 10, used to attach the load board feeder 200 to a test head, has fastening apertures 11 and pillar fastening apertures 13 therethrough. The fastening apertures 11 and the pillar fastening apertures 13 are counter sunk to allow the top of a flat head screw to lie flush with the surface of the top ring 10.

Pins 15 are inserted into pin apertures 12, for example by using a press fit, in the underside of the top ring 10. When the load board feeder 200 is attached to a test head 310 (FIG. 3), the pins 15 align with pin holes (not shown in FIG. 3) in the center ring 300 surrounding the center aperture 312. The pins 15 are not equally spaced around the circumference of the top ring 10, thus ensuring that the load board feeder is properly aligned with the test head 310 when the pins 15 are aligned with the pin holes.

Base plate pillars 20 serve as a body for the load board feeder. The present invention is not limited to pillars for a body, as other mechanical elements connecting the base plate 70 and the top ring 10 provide the same function. For example, a cylinder with a cut-out for an air tube 109 is employed in certain embodiments instead of the pillars 20. The base plate pillars 20 are attached, for example, to a base plate 70 via threaded studs 72. Each end of a base plate pillar contains a threaded stud aperture 71, of which one receives a threaded stud 72, thus joining the base plate pillar 20 to the base plate 70. The opposing end of the base plate pillar 20 rests against the underside of the top ring 10. A pillar fastening aperture 13 through the top ring 10 permits a screw to fasten the top ring 10 to the base plate pillar 20 via a threaded stud aperture 71. The pillar fastening apertures 13 are counter sunk to allow the top of a flat head screw to lie flush with the surface of the top ring 10.

The load board feeder base plate 70 provides a platform for attaching the base plate pillars 20, and a pneumatic jig cylinder 45. Slide bushings 65 and block guide shafts 60 are also attached to the base plate 70. For example, the pneumatic jig cylinder 45 is fastened via screws 74 that protrude through apertures 73 in the base plate 70. Also by way of example, the slide bushings 65 have flanges 66 at one end. The slide bushings 65 protrude through apertures 64 so that the flanges 66 contact the underside of base plate 70, and the slide bushing 65 passes through the base plate 70. Screws (not shown) through the flange 66 fasten the slide bushings 65 to the base plate 70.

Guide shafts 60 pass through the slide bushings 65. Each guide shaft 60 has a stop 80 attached to a guide shaft end to prevent the guide shaft 60 from becoming disconnected from the base plate 70. For example, the stops 80 could be welded or fastened by screws to the end of the guide shafts 60.

A load board locator block 40, is attached to the pneumatic jig cylinder 45. For example, the locator block 40 could be welded to the pneumatic jig cylinder 45, or the end of the pneumatic jig 45 could be threaded and received by a threaded aperture in the bottom of the locator block 40. The load board locator block 40 has at least a circular cavity 41 in its upper surface. A locating disk 50 is configured to fit within the cavity 41 on the upper surface of the load board locator block 40.

A load board locator plate 30 is fastened to the upper surface of the load board locator block 40, and contains an aperture 31 therethrough that allows the locating disk 50, placed in the cavity 41, to pass through the load board locator plate 30. There can be a press fit between the locating disk 50 and the aperture 31 and/or the cavity 41, but the present invention does not require a press fit. The locator plate 30 is fastened, for example, by screws that are countersunk to lie flush with the surface of the locator plate 30. The locator plate 30 protects the locator block 40 from wear.

Load board locator block guide shafts 60 freely slide through the slide bushings 65, and are attached to the underside of the load board locator block 40 by welds, threads, or other attachment. The locator block guide shafts 60 work with the slide bushings 65 to provide smooth movement of the locator block 40 when the pneumatic jig cylinder 45 moves the locator block 40. The guide shaft stoppers 80, attached to the ends of the load board locator block guide shafts 60, prevent the pneumatic jig cylinder 45 from raising the load board locator block 40 too far above the load board feeder base plate 70.

Preferably, the above components are made from aluminum so that the weight of the load board feeder is kept to a minimum and heat generated by the test head does not adversely affect the load board feeder. However, the present invention is not limited to aluminum as a construction material.

A control box 90 houses a mechanical air switch control 95. Air control valves 100 are attached to the mechanical air switch 95 and provide control of pressurized air for operation of the pneumatic jig cylinder 45. A tube fitting 105 controls the pressurized air supply to the mechanical air switch 95. Two tube fittings 110 provide pressurized air into and out of the pneumatic jig cylinder 45. The tube fittings 110 are connected to the air controllers 100 by air supply tubes 109.

Test Head Configuration

Figure 3:
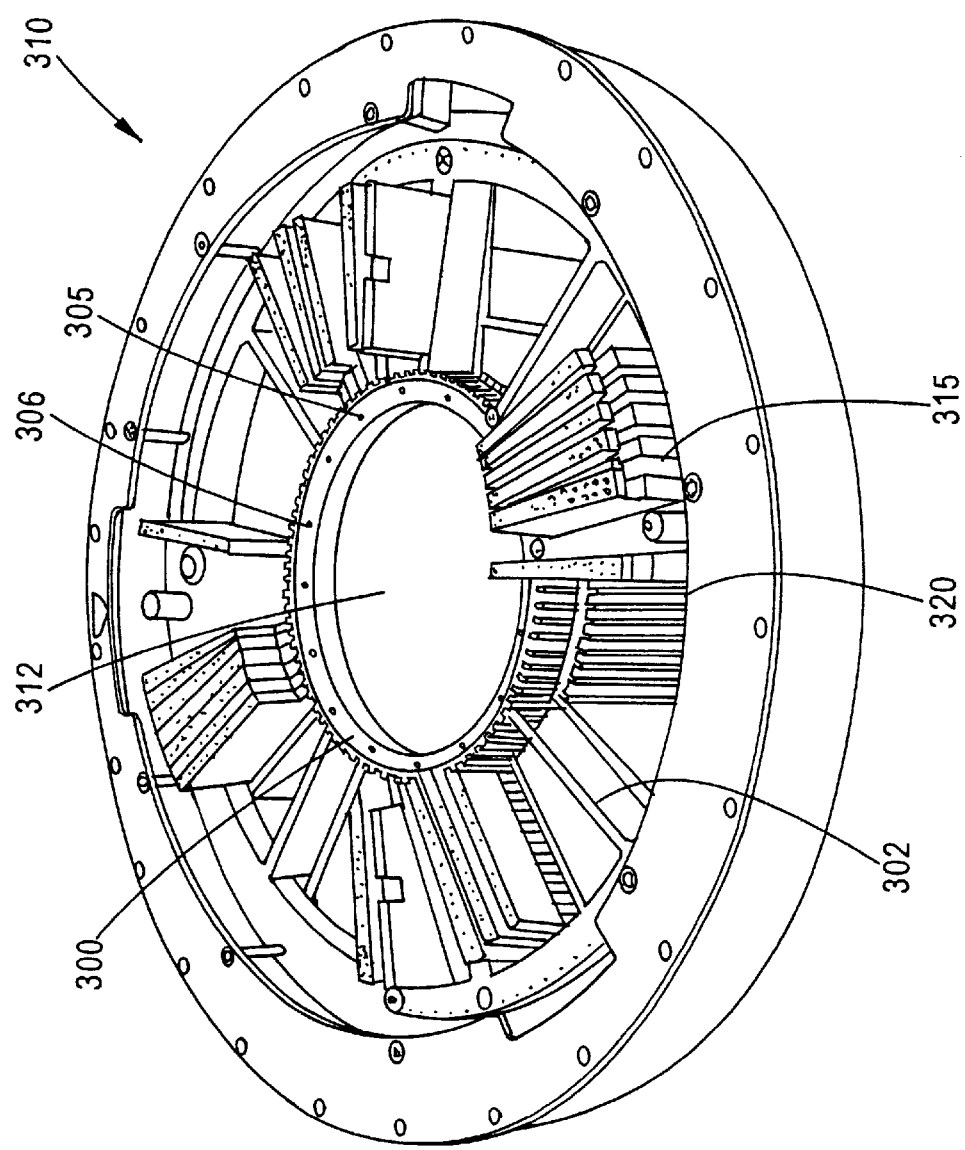
FIG. 3 depicts a test head utilized with the embodiment of a load board feeder shown in FIG. 1.

The test head described is a M973 Teradyne Tester Test Head which has a hollow center, however, any test head having a hollow center may be used with the present invention. The test head 310 depicted in FIG. 3 has a circular aperture 312 through the test head center. The upper surface of the aperture 312 forms a ring 300. As shown in FIG. 3, the inner portion of the center ring 300 has been removed, i.e., by milling, leaving a lip 306. The lip 306 assists centering the load board feeder 200 by surrounding top ring 10 when the load board feeder 200 is seated onto the test head 310, however, the lip 306 is not necessary. Apertures 305 drilled into the center ring 300 are threaded so as to provide a place for fasteners, for example screws, to fasten the load board feeder 200 via top ring 10 to the test head 310. Other methods, for example, riveting or welding, could also be used to attach the load board feeder 200, via top ring 10, to the test head 310.

Figure 9:
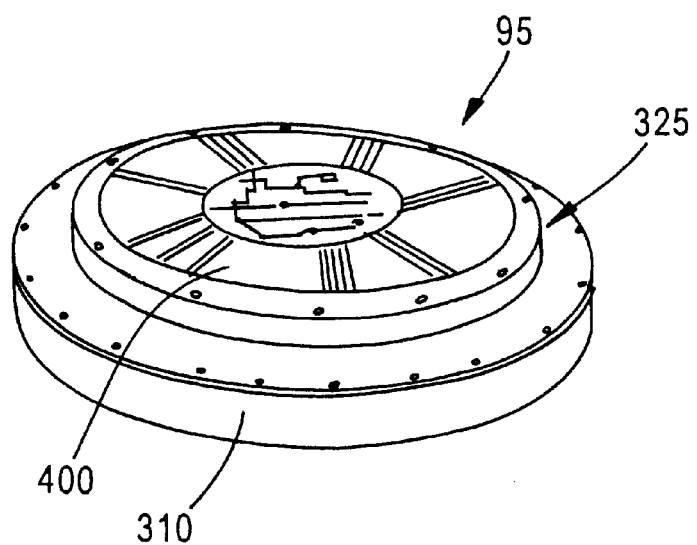
FIG. 9 depicts the load board attached to the load board stiffener as shown in FIG. 8 seated on the load board feeder depicted in FIG. 6.

The test head 310 also contains channel cards 315 that are used to control testing of load boards. Pogo pins 320 on top of the channel cards 315 provide electrical contact between the channel cards, and therefore the test head, and a load board 325 (FIG. 9). Supports 302 ensure the rigidity of the test head 310.

Seating and Fastening an Embodiment of a Load Board Feeder into a Configured Test Head FIG. 4 depicts an initial stage of seating the load board feeder 200 shown in FIGS. 1 and 2 into a configured test head 310 shown in FIG. 3. Air hoses 109 are fed from the underside of test head 310 through the center aperture 312 before being connected to the pneumatic jig cylinder 45. As shown in FIG. 4, the load board feeder 200 is seated into the test head 310 from above the test head 310.

FIG. 5 depicts aligning the load board feeder 200 with the center aperture 312 in the test head 310. As shown in FIG. 5, the circumference of the base plate 70 is small enough to pass through the center aperture 312 of the test head 310, therefore allowing the body of the load board feeder 200, i.e., base plate pillars 20, pneumatic jig cylinder 45, and block guide shafts 60, to pass through the center aperture 312. However, the circumference of top ring 10 fits just within the lip 306 (FIG. 3) and rests on the center ring 300 of the test head 310. Therefore, top ring 10 prevents the load board feeder 200 from passing completely through the center aperture 312 in the test head 310.

Figure 12:
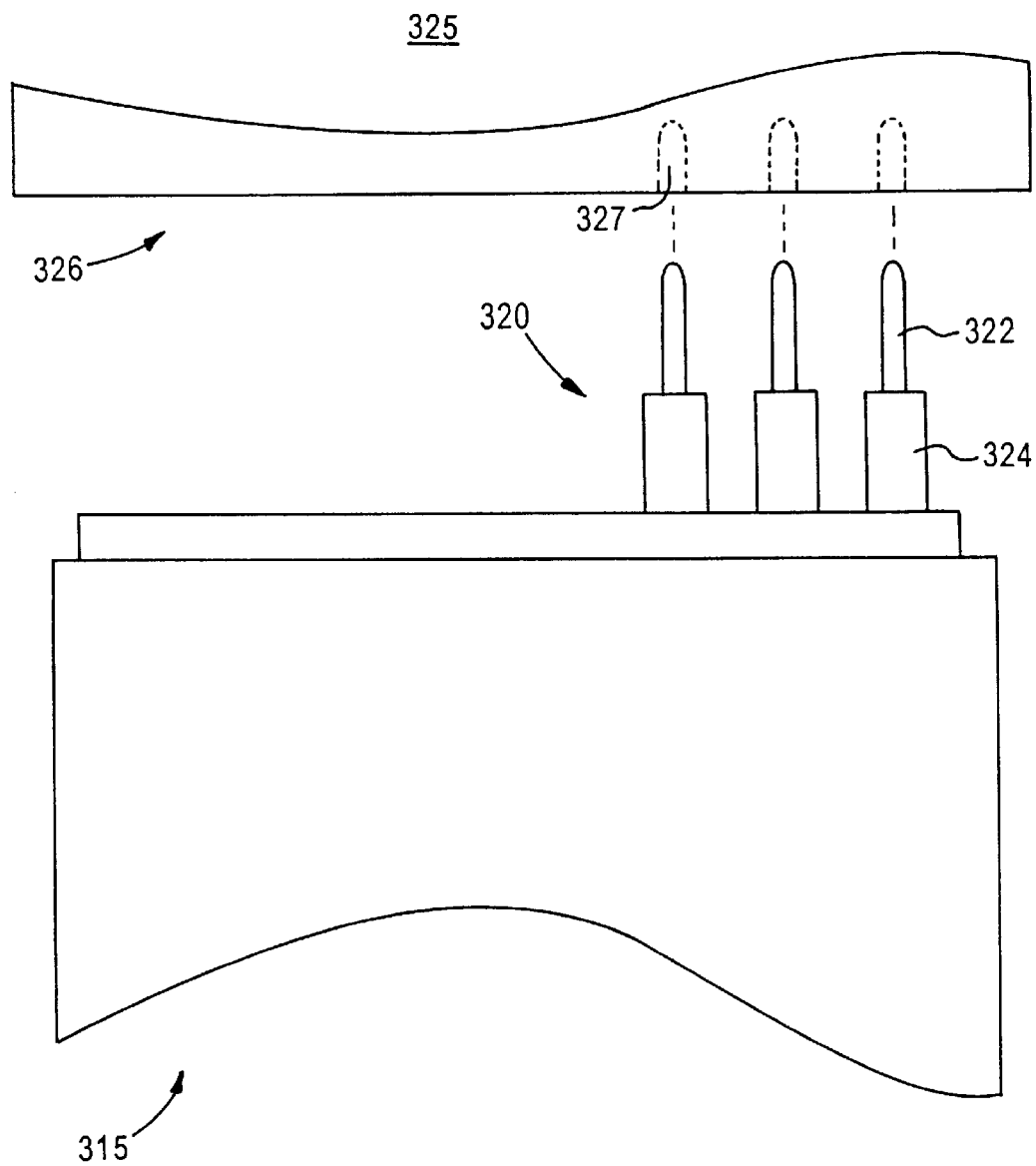
FIG. 12 depicts pogo pins clear of the load board when the embodiment of a load board feeder shown in FIG. 10 is in the up position.

FIG. 6 depicts the top ring 10 of the load board feeder 200 seated on center ring 300 of the test head 310. Pins 15 in the underside of the top ring 10 match with pin holes (not shown) in the top of center ring 300 when the load board feeder 200 is properly aligned with the test head 310. Screws pass through fastening apertures 11 in the top ring 10 and into threaded apertures 305 in the center ring 300, securing the load board feeder 200 to the test head 310. The top of the load board feeder 200 is substantially parallel with the tops of the channel cards 315. When in the up position, as depicted in FIG. 6, the top of the load board feeder 200, i.e., the locator plate 30, is above the tops of the channel cards 315 and the pogo pins 320 protruding therefrom. Having the top of the load board feeder 200 above the pogo pins 320 ensures that when a load board 325 (FIG. 9) is mounted onto the load board feeder 200 there is no contact between the load board 325 and the pogo pins 320, as depicted in FIG. 12.

Mounting a Load Board onto an Embodiment of a Load Board Feeder

For clarity, FIG. 7 depicts a load board stiffener 400, without a load board 325, mounted onto the load board feeder 200. Before mounting the load board stiffener 400 onto the load board feeder 200, a stiffener insert 410 is attached in the center of the load board stiffener 400. For example, the tolerance between the stiffener insert 410 and the inner opening of the load board stiffener 400 creates a press fit; or the stiffener insert 410 is held in place via screws or like fasteners; or welding, etc. It is relatively unimportant whether the stiffener insert 410 lies in the same plane as the top of the load board stiffener 400, or is below the top of the load board stiffener 400 and co-planar, as long as the top of the load board stiffener 400 and the stiffener insert 410 are substantially parallel. A substantially parallel relationship between the load board stiffener 400 and the stiffener insert 410 ensures that when the stiffener insert 410 flatly contacts, i.e., is not tilted, the locator plate 30, then the top of the load board stiffener 400 (and the load board 325 which is attached to the top of the load board stiffener 400) is substantially parallel with the top of the load board feeder 200. When the load board stiffener 400 is mounted onto the load board feeder 200, the load board stiffener 400 is placed so that the stiffener insert 410 rests upon the load board locator plate 30. Then, the load board stiffener 400 is gently rotated until the locating disk 50 engages a locating aperture 420 in the stiffener insert 410. The stiffener insert 410 flatly contacts the locator plate 30, and is properly aligned with the test head 310.

Figure 8:
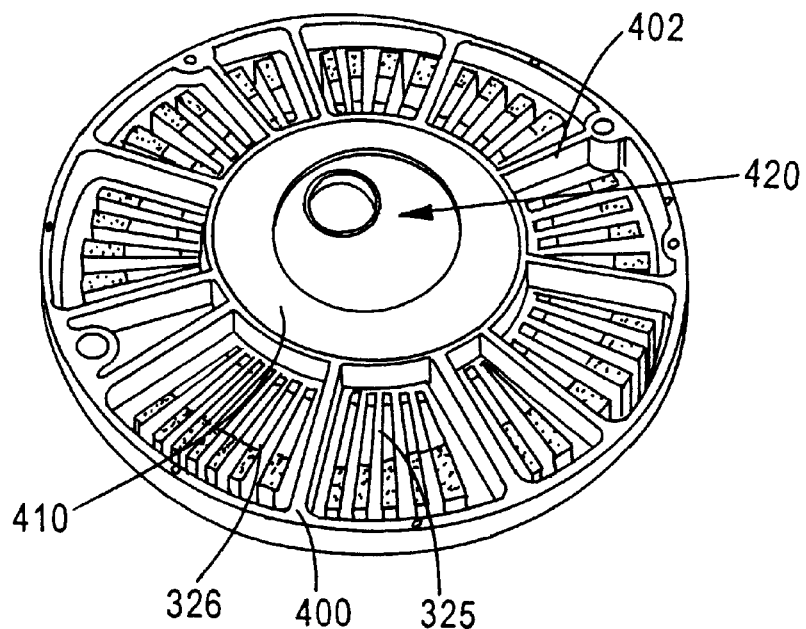
FIG. 8 depicts a bottom view of a load board attached to a load board stiffener containing a central insert placed in the load board stiffener.

The under-side of a load board stiffener 400 is shown in FIG. 8 with a load board 325 attached to the top-side of the load board stiffener 400. The load board 325 is viewed between the rigid struts 402 of the load board stiffener 400, and shows that the underside of the load board 325 contains a plurality of slots 326, each adapted to receive a channel card 315 and its associated pogo pins 320. An insert 410 is attached to the center of the load board stiffener 400 as described previously. The insert 410 allows the load board stiffener to rest upon the locator plate 30 (FIG. 6). An aperture 420 in the insert 410 is dimensioned to receive the locating disc 50. The load board 325 is fastened to the load board stiffener 400 in a predetermined manner so that when the locating disc 50 engages the aperture 420 the load board 325 is properly aligned with the test head 310. The load board 325 is fastened to the load board stiffener 400, for example, by screws or like fasteners. When the load board stiffener 400 with a load board 325 attached, as shown in FIG. 8, is mounted on the load board feeder 200, in the same manner as shown in FIG. 7, the load board 325 is automatically properly aligned with the test head 310.

Figure 10:
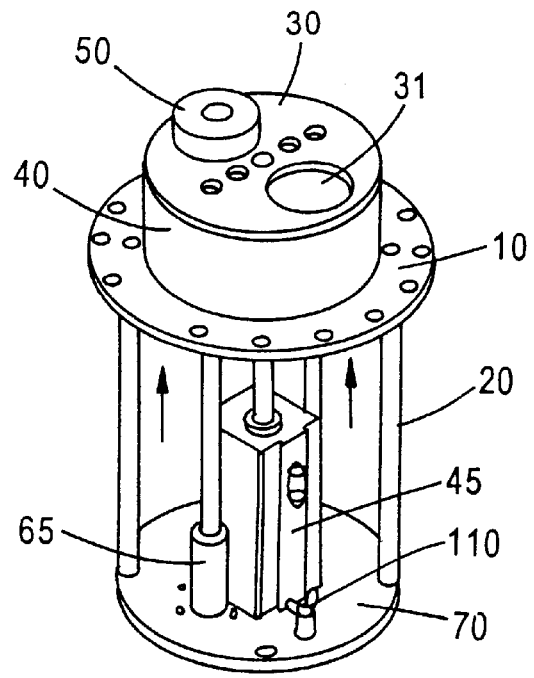
FIG. 10 depicts the embodiment of a load board feeder shown in FIG. 1 in the up position.
Figure 11:
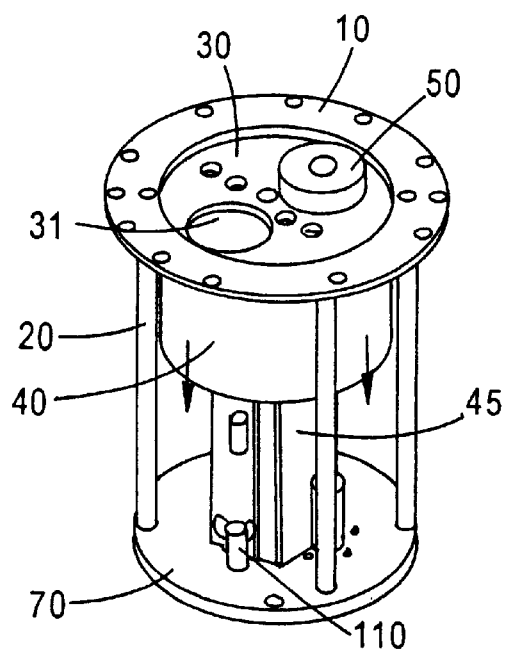
FIG. 11 depicts the embodiment of a load board feeder shown in FIG. 1 in the down position.
Figure 13:
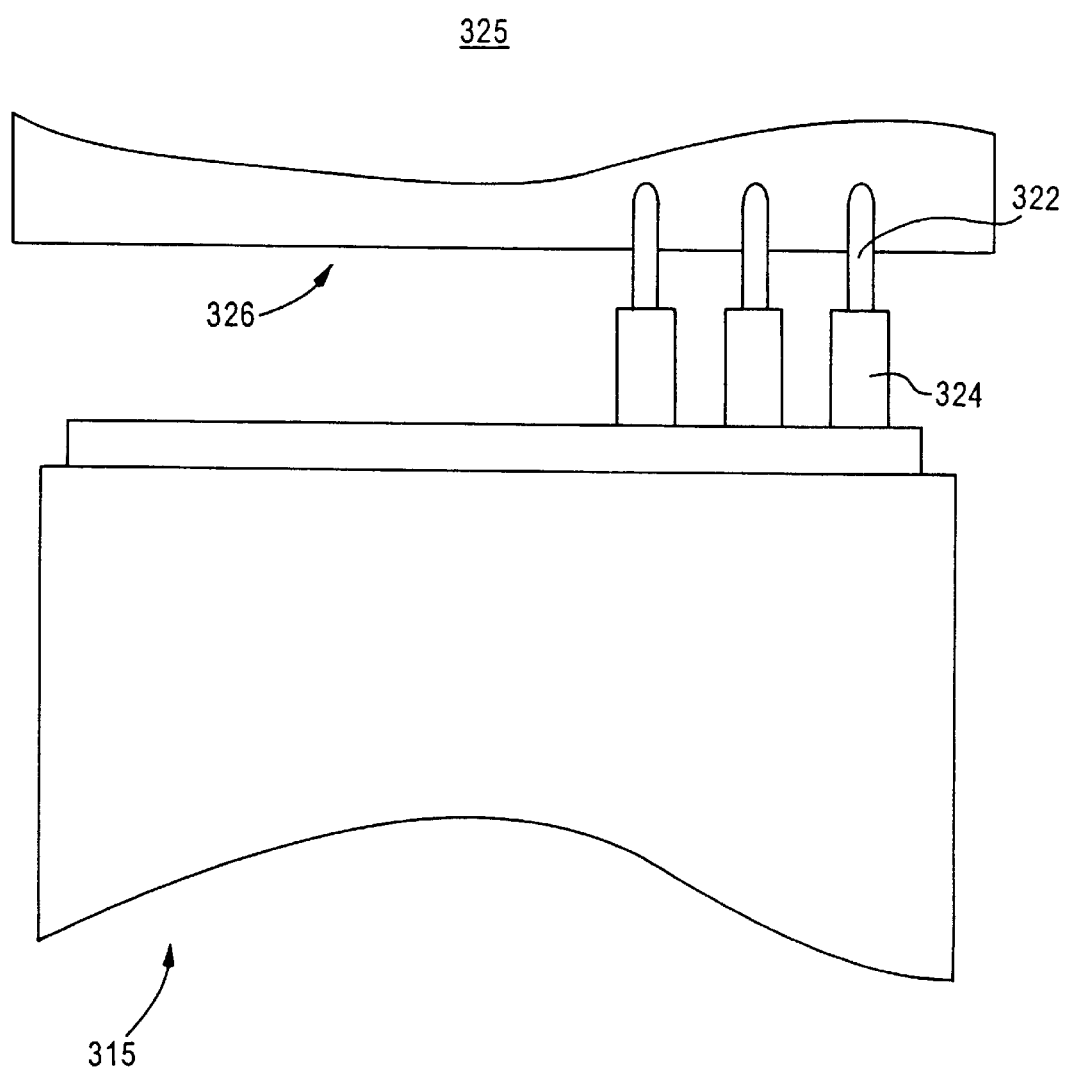
FIG. 13 depicts pogo pins contacting the load board when the embodiment of a load board feeder shown in FIG. 11 is in the down position.

An example of a load board stiffener 400, with a load board 325 attached, mounted on a load board feeder 200 (not shown) attached to a test head 310 is depicted in FIG. 9. In FIG. 9, the load board feeder 200 is in the up position, as shown in FIG. 10, and the load board 325 does not contact the pogo pins 320, as shown in FIG. 12. When the load board feeder 200 is moved to the down position, as shown in FIG. 11, the load board 325 contacts the pogo pins 320, as shown in FIG. 13, and is approximately flush with the top of the test head 310.

Operation of an Embodiment of a Load Board Feeder

A load board 325 is attached to a load board stiffener 400 as described above. A load board feeder 200 is attached to a test head 310 as described above. The load board 325 is then mounted onto the load board feeder 200, and as described above, is automatically aligned with the test head 310.

The mechanical air switch 95 is moved to the down position thereby activating the pneumatic jig cylinder 45 which lowers the load board 325 onto the test head 310. Block guide shafts 60 provide smooth movement of the load board 325 so there is no adverse impact when the slots 326 on the underside of the load board 325 engage the pogo pins 320 on top of the channel cards 315. By combining proper alignment of the load board 325 to the test head 310 with smooth, controlled movement of the locator block 40, the load board feeder 200 ensures that pogo pins 320 correctly contact the load board 325 without damaging the pogo pins 320.

FIG. 11 depicts the load board feeder 200 in the fully down position. Note that in the down position, the locator plate 30 is slightly below the top ring 10, ensuring that the load board 325 engages the pogo pins 320 (FIG. 13) and is not held out of contact with any of the pogo pins 320 by the load board feeder 200. When the load board 325 engages the channel cards 315, the pogo pins 320 of an individual channel card 315 contact a slot 326 on the underside of the load board 325 having receptors 327 (FIG. 12) that engage the pogo pin portion 322. As the load board 325 is seated, the springs in portion 324 of each pogo pin 320 compress. Spring compression within pogo pin portion 324 ensures that the load board 325 contacts all of the pogo pins 320 on the various channel cards 315 within the test head 310, even when there are minor height variations between the channel cards 315. Once the load board 325 is seated onto the test head 310, the load board 325 is connected to the test head 310. For example, this connection is accomplished by pressing a latch button (not shown) on the test head 310.

To remove the load board 325 from the test head 310, the load board 325 is disconnected from the test head 310. For example, this disconnection is accomplished by pressing a de-latch button (not shown) on the test head 310. The mechanical air switch 95 is moved to its up position, activating the pneumatic jig cylinder 45 which raises the locator block 40. As previously described, the block guide shafts 60 provide smooth movement of the locator block 40. This smooth movement ensures that the pogo pins 320 are not damaged by erratic movement of the load board 325 while separating from the pogo pins 320.

Thus, the load board stiffener 400 with the load board 325 attached is raised to a point where the load board 325 is no longer contacting the pogo pins 320 (FIG. 12). Once the load board feeder 200 has reached its fully raised position (FIG. 10) the load board stiffener 400 with the load board 325 attached is removed from the load board feeder 200.

The present invention provides pre-alignment of a load board with a test head before the load board is seated onto the test head. The present invention also moves the load board in a vertical direction in a smooth and controlled manner. By pre-aligning the load board with the test head, and smoothly engaging the load board with the test head, the present invention eliminates adverse impact upon the delicate pogo pins that are part of the channel cards in the test head that provide electrical contact between the test head and load board. The present invention significantly reduces the amount of damage caused to pogo pins from manually placing a load board onto a test head and adjusting the load board to properly align it with the test head once the load board is resting on the test head. By decreasing damage to the pogo pins, the present invention increases the amount of time that a test head is used for testing integrated circuits, and greatly reduces the frequency of replacing expensive channel cards.

While this invention has been described in connection with what is presently considered to be the most practical and preferred embodiment, the invention is not limited to the enclosed embodiments, but on the contrary, is intended to cover various modifications and equivalent arrangements included within the spirit and scope of the appended claims.

What is claimed is:

1. A load board feeder apparatus for seating a load board on a test head having a hollow center, comprising:

a base;

a body connected to the base;

an attachment device connected to the body configured for attaching the load board feeder apparatus to the test head;

a lift mechanism attached to the top side of the base configured to move a block that is attached at a bottom surface to the lift mechanism to seat and unseat a load board onto and off of the test head; and a load board location device on the block configured to receive a load board wherein:

the apparatus is configured to fit within the hollow center of the test head; and the body further comprises at least a shaft with a first end attached to a top side of the base and extending vertically from the base having a second end remote from the base.

2. The apparatus of claim 1, wherein:

the apparatus is cylindrically shaped;

the attachment device is a flat ring attached to the second ends of a plurality of shafts; and the circumference of the attachment device is greater than the circumference of the base.

3. The apparatus of claim 2, wherein:

the attachment device has a plurality of holes therethrough that align with a plurality of holes in the test head permitting fastening of the attachment device to the test head.

4. The apparatus of claim 2, wherein:

the block passes through the center of the attachment device.

5. The apparatus of claim 2, wherein the load board location device comprises:

at least a non-concentric, circular cavity in the top surface of the block;

a circular plate attached to the top surface of the block having at least a non-concentric, circular aperture therethrough aligned with at least the non-concentric circular cavity in the top surface of the block and having approximately the same diameter as the non-concentric circular cavity in the top surface of the block; and a circular disk configured to fit within the circular cavity and circular aperture;

wherein a first surface of the circular disk contacts the bottom of the circular cavity and a second surface of the circular disk rises above the circular plate; and wherein the circular disk engages a circular cavity when the load board is aligned with the test head.

6. The apparatus of claim 5, further including an insert for the center of a load board stiffener comprising:

a circular body; and a non-concentric aperture; wherein the body is press fit into a central opening of the load board stiffener; and the non-concentric aperture is configured to receive the portion of the circular disk rising above the circular plate.

7. A load board feeder apparatus for seating a load board on a test head having a hollow center, comprising:

a base;

a body connected to the base;

an attachment device connected to the body configured for attaching the load board feeder apparatus to the test head;

a lift mechanism attached to the top side of the base configured to move a block that is attached at a bottom surface to the lift mechanism to seat and unseat a load board onto and off of the test head;

a load board location device on the block configured to receive a load board;

at least a guide rod having a first end attached to the bottom side of the block and a second end extending through the base;

for each guide rod, an aperture in the base allowing the guide rod to pass through the base; and for each guide rod, a linear bearing attached to the base and receiving the guide rod therethrough;

wherein each guide rod and linear bearing combination provide smooth vertical movement for the block when the lift mechanism moves the block.

8. The apparatus of claim 7, wherein:

at least a linear bearing comprises a bushing having a flange on one end; and at least a flange is attached to the bottom side of the base so that the bushing extends through an aperture in the base.

9. The apparatus of claim 7, further comprising;

a stop attached to the second end of at least a guide rod.

10. A load board feeder apparatus for seating a load board on a test head having a hollow center, comprising:

a base;

a body connected to the base;

an attachment device connected to the body configured for attaching the load board feeder apparatus to the test head;

a pneumatic jig cylinder attached to the top side of the base configured to move a block that is attached at a bottom surface to the lift mechanism to seat and unseat a load board onto and off of the test head;

a load board location device on the block configured to receive a load board;

a remote switch for operating the pneumatic jig cylinder; and pneumatic connections connecting the switch to the pneumatic jig cylinder.

11. The apparatus of claim 10, wherein:

the switch is a mechanical switch.

12. A method of seating a load board on a test head with a hollow center comprising the steps of:

attaching a load board feeder in the center of a test head;

wherein the load board feeder comprises a lift mechanism and a location device for aligning a load board with a test head;

raising the load board feeder to its raised position;

placing a load board on the load board feeder;

aligning the load board with the test head utilizing the location device;

activating the lift mechanism to lower the load board onto the test head; and securing the load board to the test head.

13. The method of claim 12, wherein aligning the load board further comprises the step of:

rotating the load board until it engages the location device.

14. The method of claim 12, further comprising the steps of:

unsecuring the load board from the test head;

activating the lift mechanism to raise the load board above the test head; and removing the load board from the load board feeder.

* * * * *